(12) United States Patent
Park

(10) Patent No.: US 7,719,907 B2
(45) Date of Patent: May 18, 2010

(54) TEST CIRCUIT FOR SEMICONDUCTOR MEMORY DEVICE

(75) Inventor: Kee-Teok Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 449 days.

(21) Appl. No.: 11/717,709

(22) Filed: Mar. 14, 2007

(65) Prior Publication Data

US 2008/0002505 A1 Jan. 3, 2008

(30) Foreign Application Priority Data

Jun. 30, 2006 (KR) .................... 10-2006-0060290

(51) Int. Cl.
*G11C 29/00* (2006.01)

(52) U.S. Cl. .................. 365/201; 365/200; 365/230.06; 365/189.05; 714/724; 714/725; 714/733; 714/734

(58) Field of Classification Search .................. 365/201, 365/200, 230.06, 189.05; 714/724, 725, 714/733, 734
See application file for complete search history.

(56) References Cited

U.S. PATENT DOCUMENTS

| | | | |
|---|---|---|---|
| 5,263,031 A | | 11/1993 | Inoue |
| 5,349,559 A | * | 9/1994 | Park et al. .................... 365/201 |
| 5,557,232 A | * | 9/1996 | Shimogawa ................ 327/545 |
| 5,687,180 A | | 11/1997 | Kawasaki |
| 5,790,459 A | * | 8/1998 | Roohparvar ........... 365/185.21 |
| 5,901,105 A | | 5/1999 | Ong et al. |
| 5,946,242 A | * | 8/1999 | Cho et al. .............. 365/189.06 |
| 5,956,278 A | * | 9/1999 | Itou ........................... 365/201 |
| 6,038,189 A | * | 3/2000 | Morishita .................... 365/227 |
| 6,744,271 B2 | * | 6/2004 | Baker ......................... 324/763 |
| 6,940,765 B2 | | 9/2005 | Kyung |
| 2005/0231271 A1 | * | 10/2005 | Jin ............................. 327/541 |
| 2007/0050692 A1 | * | 3/2007 | Jang et al. ................... 714/724 |

FOREIGN PATENT DOCUMENTS

| | | |
|---|---|---|
| JP | 07-058297 | 3/1995 |
| JP | 9-106698 A | 4/1997 |
| JP | 2005-71582 A | 3/2005 |
| KR | 10-2000-0003355 A | 1/2000 |
| KR | 10-2002-0053479 A | 7/2002 |

OTHER PUBLICATIONS

Korean Office Action with corresponding Korean Patent Application No. KR 10-2006-0060290, dated on Dec. 31, 2007.

* cited by examiner

*Primary Examiner*—Van Thu Nguyen
*Assistant Examiner*—Eric Wendler
(74) *Attorney, Agent, or Firm*—IP & T Law Firm PLC

(57) ABSTRACT

A semiconductor memory device is capable of performing a normal operation, while detecting an internal voltage without a special bonding method during a test mode. The semiconductor memory device comprises a switching unit and an internal reference voltage generating unit. The switching unit transfers one of an internal and an external reference voltages according to whether a test mode is being performed, wherein the external reference voltage is input from outside of the semiconductor memory device. The internal reference voltage generating unit generates the internal reference voltage having the same level of the external reference voltage to thereby supply the internal reference inside the semiconductor memory device during the test mode.

14 Claims, 1 Drawing Sheet

TEST CIRCUIT FOR SEMICONDUCTOR MEMORY DEVICE

CROSS-REFERENCE TO RELATED APPLICATIONS

The present invention claims priority of Korean patent application no. 10-2006-0060290, filed in the Korean Patent Office on Jun. 30, 2006, which is incorporated by reference in its entirety.

BACKGROUND OF THE INVENTION

The present invention relates to a semiconductor memory device; more particularly, to semiconductor memory device capable of detecting an internal voltage in a package.

Semiconductor memory devices are generally manufactured through a wafer process. A plurality of tests are performed to examine the reliability of internal circuits in a device. Semiconductor memory devices, such as a dynamic random access memory (DRAM) and a static random access memory (SRAM), are examined by such tests. The reliability tests for the semiconductor memory device are mainly categorized as wafer tests and package tests. The wafer tests are performed before a packaging process for a device and the package tests are performed after the packaging process for the device.

Accordingly, the package tests for detecting the internal voltage of the semiconductor memory device in the package or detecting a common potential by coupling each internal voltage node requires a special bonding method. For the special bonding, a part of data pins or a part of address pins is required to be boned with a predetermined pad which the test will be performed through.

Because the part of data pins or the part of address pins is used only for the test when detecting the internal voltage through the special bonding method, regular operations or other tests which use the parts of data and address pins for its real purpose cannot be performed normally.

SUMMARY OF THE INVENTION

Embodiments of the present invention are directed at providing a semiconductor memory device capable of performing normal operations, while detecting an internal voltage without a special bonding method during a test mode.

In accordance with an aspect of the present invention, a semiconductor memory device comprises a switching unit for transferring one of internal and external reference voltages according to whether the device is in a test mode, wherein the external reference voltage is input from outside of the semiconductor memory device, and an internal reference voltage generating unit for generating the internal reference voltage having the same level of the external reference voltage to thereby supply the internal reference inside the semiconductor memory device during the test mode.

In accordance with an another aspect of the present invention, a semiconductor memory device, including an internal voltage generator for receiving a plurality of internal voltages and transmitting internal voltage for a test in response to a control signal corresponding to the internal voltage; and an internal reverence voltage generating unit for generating an internal reference voltage, as the same level of an external reference voltage, and transmitting one of the internal and the external reference voltages to an internal circuit in response to a test control signal.

In accordance with another aspect of the present invention, there is provided a semiconductor memory device, including a pad for transmitting an external reference voltage to an internal circuit at a normal mode and receiving an internal voltage for testing during a test mode, a first switching unit for supplying the internal voltage in response to a first control signal at the test mode, a second switching unit for transmitting the external reference voltage to an internal circuit in response to a second control signal at the normal mode, an internal reference voltage generator for generating an internal reference voltage, as the same level of the external reference voltage, and a third switching unit for transmitting the internal reference voltage to the internal circuit in response to the second control signal at the test mode.

DESCRIPTION OF SPECIFIC EMBODIMENTS

A semiconductor memory device of the present invention performs a normal operation, while detecting an internal voltage without the special bonding method. Because an input buffer operates normally during a test mode, a variety of tests can be performed. The pad receiving the external reference voltage is used for detecting the internal voltage. Accordingly, it is more efficient to perform tests than employing the conventional technique.

Hereinafter, a semiconductor memory device in accordance with the present invention will be described in detail referring to the accompanying drawings.

Figure 1:
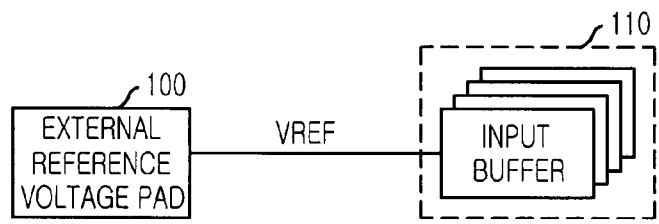
FIG. 1 is a block diagram of a semiconductor memory device for receiving an external reference voltage.

FIG. 1 is a block diagram of a semiconductor memory device for receiving an external reference voltage. The semiconductor memory device includes an external reference voltage pad 100 and a plurality of internal circuits such as an input buffer 110.

In a test operation, the external reference voltage pad 100 receiving an external reference voltage VREF is used, in order to detect an internal voltage without the special bonding method while normal operation is performed. Meanwhile, the external reference voltage VREF is transmitted to the input buffer 110 through the external reference voltage pad 100 in a normal operation.

Figure 2:
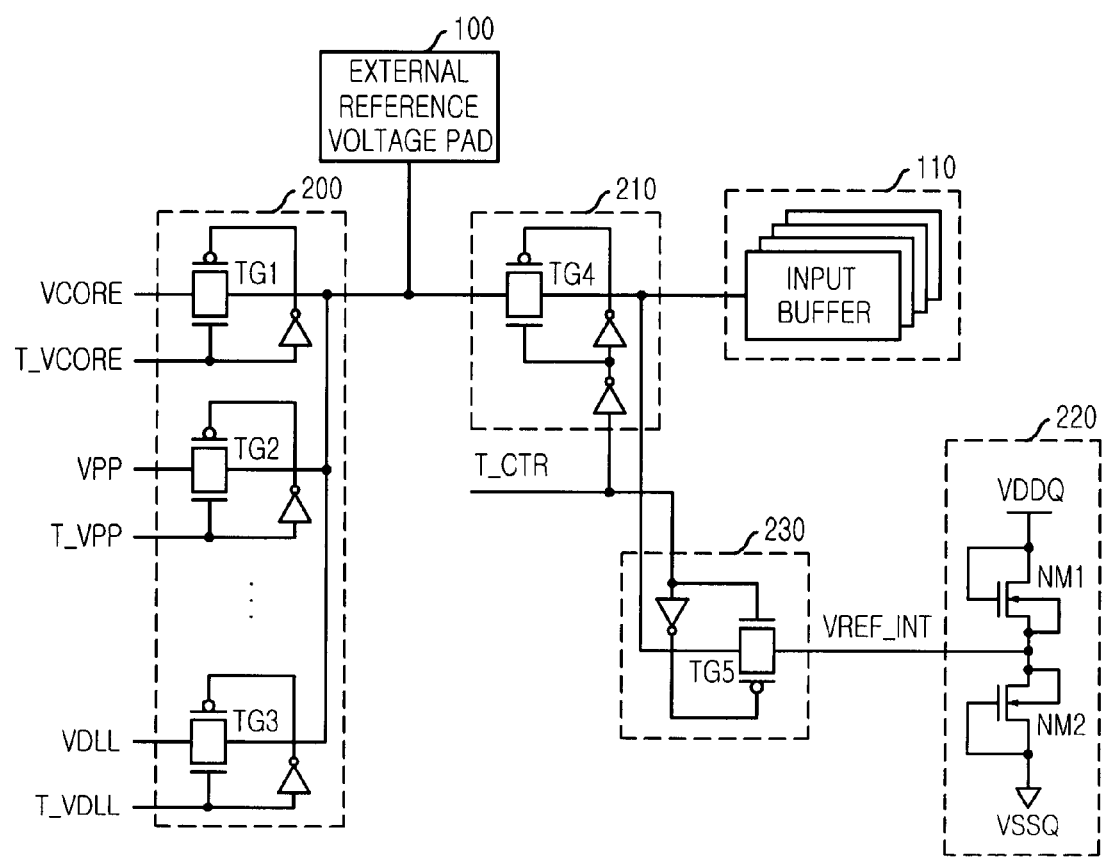
FIG. 2 is a schematic circuit diagram of a semiconductor memory device in accordance with the present invention.

FIG. 2 is a schematic circuit diagram of a semiconductor memory device in accordance with an embodiment of the present invention. The semiconductor memory device of the present invention includes the external reference voltage pad 100, an input buffer 110, a first switching unit 200, a second switching unit 210, an internal reference voltage generator 220 and a third switching unit 230.

The semiconductor memory device performs normal operations, such as a data access operation, during a test mode, while detecting an internal voltage without a special bonding method. While used to transmit an external reference voltage VREF to the input buffer 110 in a normal mode, and the external reference voltage pad 100 is used to detect the internal voltage in the test mode.

The first switching unit 200 is formed between an internal voltage node and the external reference voltage pad 100. The first switching unit 200 is provided with a plurality of transmission gates TG1 to TG3 to transmit one of a plurality of internal voltages, such as a core voltage VCORE, a pumping voltage VPP and a delay locked loop voltage VDLL, in the test mode. Each transmission gate receives a corresponding internal voltage and transmits the internal voltage to the external reference voltage pad 100 in response to corresponding control signals T_VCORE, T_VPP and T_VDLL.

For example, the first transmission gate TG1, receiving the core voltage VCORE at the test mode, transmits the core voltage VCORE to the external reference voltage pad 100 in response to the control signal T_VCORE for testing the core voltage VCORE. Similarly, the second and the third transmission gates TG2 and TG3, respectively receiving the pumping voltage VPP and the delay locked loop voltage VDLL, transmit the each internal voltage to the external reference voltage pad 100 in response to the control signal corresponding to the each internal voltage.

Only one internal voltage is tested at once in above embodiment of the present invention. However, a common connection test is possible according to the kind of internal voltages. For example, a bit line precharge voltage VBLP and a cell plate voltage VCP can be tested at once by holding in common according to the control signal.

The second switching unit 210 is formed between the external reference voltage pad 100 and the input buffer 110. The second switching unit 210 supplies the external reference voltage VREF, received through the external reference voltage pad 100, to the input buffer 110 in the normal mode. The second switching unit 210 is provided with a fourth transmission gate TG4 corresponding to a test control signal T_CTR, which is enabled in the test mode.

The test control signal T_CTR becomes a logic high level at the test mode and a logic low level at the normal mode. The fourth transmission gate TG4 turns on at the normal mode and supplies the external reference voltage VREF to the input buffer 110. The fourth transmission gate TG4 turns off in the test mode and prevents the internal voltage for testing from inputting to the input buffer 110.

The internal reference voltage generator 220 divides an external supply voltage VDDQ and generates an internal reference voltage VREF_INT. The internal reference voltage VREF_INT has a substantially same voltage level as the external voltage level VREF, where there is no problem for operation of the input buffer 100. The internal reference voltage generator 220 is provided with NMOS transistors NM1 and NM2. The two NMOS transistor NM1 and NM2, connected in series between the external supply voltage VDDQ and a ground voltage VSSQ, output the internal reference voltage VREF through a common node.

The internal reference voltage VREF_INT can be generated by the internal reference voltage generator 220 of the present invention and then supplied into other devices in the semiconductor memory device. If the internal reference voltage VREF_INT, input to the input buffer 110, is about 1.3V and a 1.3V level of voltage is used in the semiconductor memory device, the internal reference voltage generator 220 can be omitted.

The third switching unit 230 is formed between the input buffer 110 and internal reference voltage generator 220. The third switching unit 230 supplies the internal reference voltage VREF_INT to input buffer 110 at the test mode, which is provided with a fifth transmission gate TG5 corresponding to the test control signal T_CTR.

The fifth transmission gate TG5 turns on at the test mode and transmits the internal reference voltage VREF_INT to the input buffer 110. The fifth transmission gate TG5 turns off at the normal mode.

The internal reference voltage VREF_INT, having the practically same voltage level as the external reference voltage VREF, is generated during test mode in the present invention. Because the internal reference voltage VREF_INT is substituted for the external reference voltage VREF and supplied to the input buffer 110, the normal operation can be performed in the test mode. In addition, the internal voltage can be detected through the external reference voltage pad 100.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a switching unit for receiving an internal reference voltage and an external reference voltage and selectively transferring one of the internal reference voltage and the external reference voltage according to whether a test mode is performed, wherein the external reference voltage is input from outside of the semiconductor memory device;
    an internal voltage generator for transferring one of a plurality of internal voltages to outside of the semiconductor memory device in response to a corresponding one of a plurality of control signals during the test mode; and
    an internal reference voltage generating unit for generating the internal reference voltage having substantially the same level as the external reference voltage to thereby supply the internal reference voltage inside the semiconductor memory device during the test mode.

2. The semiconductor memory device of claim 1, further including:
    a pad where the external reference voltage is input during a normal mode and the internal voltage for testing is output during the test mode.

3. The semiconductor memory device of claim 1, wherein the internal voltage generator includes:
    a plurality of transmission gates for selectively outputting the internal voltages in response to the corresponding control signals; and
    a plurality of inverters, one connected in parallel to each transmission gate, for receiving the control signals.

4. The semiconductor memory device of claim 1, wherein the switching unit includes:
    a first switching unit for transmitting the external reference voltage to the internal circuit in response to a test control signal; and
    a second switching unit for transmitting the internal reference voltage to the internal circuit in response to the test control signal.

5. The semiconductor memory device of claim 1, wherein the internal reference voltage generating unit includes:
    a first NMOS transistor for receiving a power supply voltage through a gate and a drain and outputting the internal reference voltage from a source; and
    a second NMOS transistor connected between the first NMOS transistor and a ground voltage for having a gate and a source in common.

6. The semiconductor memory device of claim 4, wherein the first switching unit includes:
    a first inverter for receiving the test control signal;
    a second inverter connected in parallel to a first transmission gate for receiving an output of the first inverter; and
    the first transmission gate for selectively transmitting the external reference voltage to the internal circuit in response to an output of the second inverter.

7. The semiconductor memory device of claim 4, wherein the second switching unit includes:

a third inverter connected in parallel to a second transmission gate for receiving the test control signal; and the second transmission gate for selectively transmitting the internal reference voltage to the internal circuit in response to an output of the third inverter.

8. A semiconductor memory device, comprising a pad for transmitting an external reference voltage to an internal circuit during a normal mode and for transmitting internal voltages for testing during a test mode;

a first switching unit for supplying one of the plurality of internal voltages for testing to the pad, in response to corresponding voltage control signals, during the test mode;

a second switching unit for receiving the external reference voltage and the internal voltage and selectively transferring one of the internal reference voltage and the external reference voltage according to whether a test mode is performed; and an internal reference voltage generator for generating the internal reference voltage, at substantially the same level as the external reference voltage, wherein the second switching unit includes:
    a first switch for transmitting the external reference voltage to the internal circuit in response to a test control signal during the normal mode; and
    a second switch for transmitting the internal reference voltage to the internal circuit in response to the test control signal during the test mode.

9. The semiconductor memory device as recited in claim 8, wherein the internal voltage is selected from a group comprising a core voltage, a pumping voltage and a delay locked loop voltage.

10. The semiconductor memory device as recited in claim 8, wherein the level of the internal voltage is determined by combining at least two internal voltages.

11. The semiconductor memory device as recited in claim 8, wherein the first switching unit includes a plurality of transmission gates formed between the pad and the internal voltages for transmitting one of a plurality of internal voltages in response to the corresponding voltage control signals as the internal voltage for testing.

12. The semiconductor memory device of claim 8, wherein the second switching unit includes a transmission gate formed between the pad and the internal circuit for receiving the test control signal.

13. The semiconductor memory device of claim 8, wherein the third switching unit includes a transmission gate formed between the internal reference voltage generator and the internal circuit for receiving the test control signal.

14. The semiconductor memory device of claim 8, wherein the internal voltage generator generates the internal reference voltage by dividing an external supply voltage.

* * * * *